United States Patent [19]

Berger et al.

[11] 3,816,758

[45] June 11, 1974

[54] DIGITAL LOGIC CIRCUIT

[75] Inventors: Horst Heinz Berger, Sindelfingen; Siegfried K. Wiedmann, Stuttgart, Germany

[73] Assignee: International Business Machines Corporation, Armonk, N.Y.

[22] Filed: Mar. 15, 1973

[21] Appl. No.: 341,424

Related U.S. Application Data

[62] Division of Ser. No. 134,008, April 14, 1971, Pat. No. 3,736,477.

[52] U.S. Cl. .................. 307/214, 307/215, 307/313

[51] Int. Cl. ...................... H03k 19/40, H03k 19/34

[58] Field of Search ..................... 307/214, 215, 313

[56] References Cited

UNITED STATES PATENTS 2,820,199 1/1958 Greefkes ........................ 307/313 X 3,534,281 10/1970 Hillhouse ........................ 307/313 X

*Primary Examiner*—John Zazworsky

*Attorney, Agent, or Firm*—Martin G. Reiffin; Wesley De Bruin

[57] ABSTRACT

A monolithic semiconductor circuit comprises a lateral PNP transistor and an inversely operated vertical NPN transistor. The lateral transistor is formed by a pair of mutually spaced P-type regions diffused in an N-type semiconductor body. The collector region has diffused therein a region of N-type and constituting the collector of the vertical transistor. The semiconductor body constitutes the base region of the lateral transistor and the emitter region of the vertical transistor.

17 Claims, 9 Drawing Figures

FIG. 1a
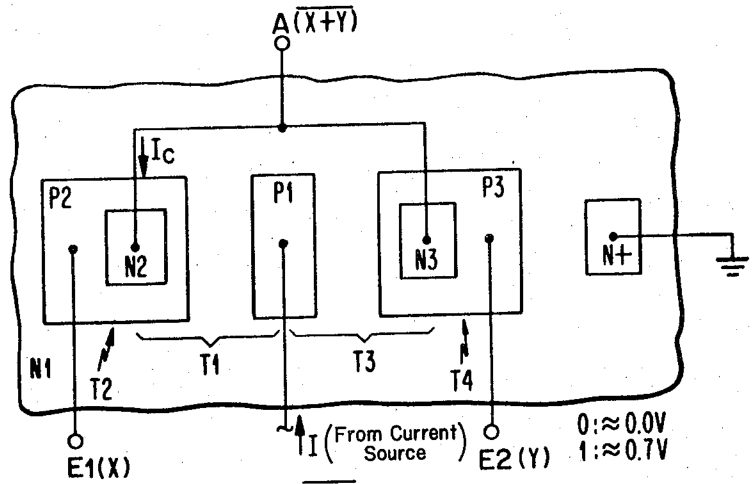
FIG. 1b
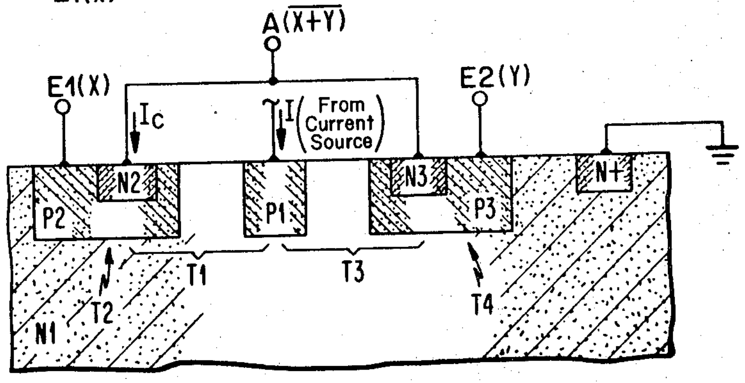
FIG. 1c
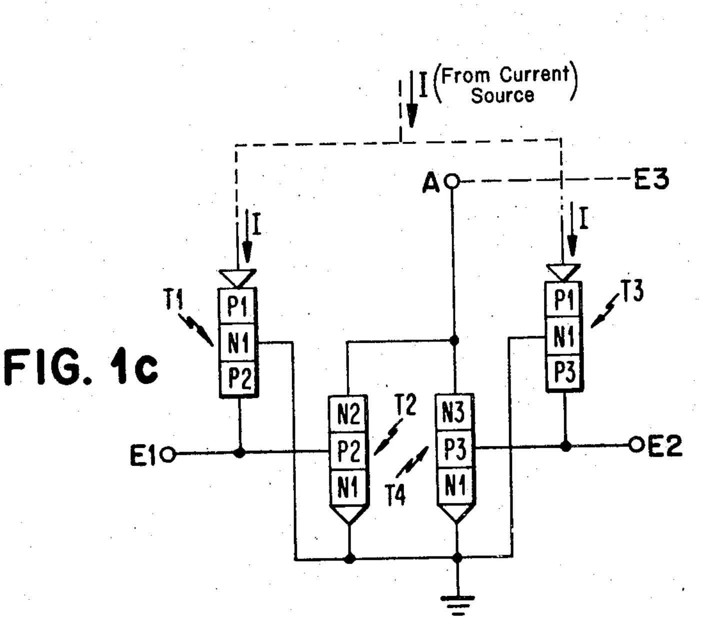
NOR
| E1 | E2 | A |
|---|---|---|
| 0 | 0 | 1 |
| 0 | 1 | 0 |
| 1 | 0 | 0 |
| 1 | 1 | 0 |
FIG. 1d

DIGITAL LOGIC CIRCUIT

CROSS-REFERENCE TO RELATED APPLICATION

This application is a division of our prior copending U.S. Pat. application Ser. No. 134,008 filed Apr. 14, 1971 and entitled "Monolithic Semiconductor Circuit for a Logic Circuit Concept of High Packing Density," now U.S. Pat. No. 3,736,477, granted May 29, 1973.

BACKGROUND OF THE INVENTION

Currently, several "logic circuit families" are known, and may be divided into those in unipolar (FET) and those in bipolar technology. Particularly well-known are RTL (resistor-transistor-logic), DTL (diode-transistor-logic), TTL (transistor-transistor-logic) and ECL (emitter-coupled-logic) circuit families.

At the moment the highest packing density in bipolar monolithic integrated logic circuits is obtained by means of TTL's. Although, in comparison with standard bipolar technology FET technology offers even higher packing densities, the disadvantages involved, such as incompatibility with the level values of bipolar logic circuits, are quite substantial.

For reasons of cost and reliability, attempts are being made to accommodate a maximum number of circuit components on a single chip. With regard to the realization of semiconductor circuits, another permanent aim consists in reducing or simplifying the number of process steps required. In order to accommodate a greater number of circuit components on a single semiconductor chip, its surface usually has to be increased. This initially leads to the number of chips obtainable from a circular semiconductor wafer to be reduced and the yield obtainable from a wafer to decrease rapidly. In order to ensure high yields, the layout must be such that the circuit requires only a very small area.

Diffused resistors, which should be avoided at all costs, require a very great area. However, in the case of the above-mentioned TTL circuits, which consist in the main of transistors, as well as in the case of known bipolar semiconductor circuits, it had been necessary to set aside large semiconductor areas to permit insulating the partial circuits against each other. As the isolation diffusion must extend through the whole epitaxial layer down to the substrate, inevitable lateral outdiffusions occur which are of about the same order as the vertical diffusion depth. In addition to the isolation diffusion width, the tolerance problems caused by the special masking step detrimentally affect the packing densities obtainable. Moreover, the diffusion step entails additional time and process requirements and leads to reduced yields.

With regard to bipolar circuits in monolithic technology, an improvement over the "usual layout," which provides separate isolation pockets for each circuit element, consists in grouping several circuit components in one isolation pocket. Semiconductor zones connected to the same potential are preferably jointly integrated. It is also known for NPN and PNP transistors to be jointly integrated in a four-layer structure. In a known circuit of this kind the NPN transistor integrated jointly with the PNP transistor acts as an antisaturation element (Microelectronic Circuits and Application, J. M. Carrol, McGraw Hill 1965, p. 76, FIG. 4). However, these known circuits are not logic circuits. Apart from this, they cannot be realized without the area-consuming isolation diffusion, nor do they lead to a simplification of or savings in the process steps employed. This applies in particular to semiconductor circuits with jointly integrated NPN and PNP transistors.

SUMMARY OF THE INVENTION

It is the object of the invention to provide a logic semiconductor circuit concept in bipolar technology which can be produced to have an extremely high packing density by means of a simplified manufacturing process, the basic circuit of which is highly flexible with regard to its use in different complex networks, and in which the complex networks thus realized are fully compatible with other logic circuit families in bipolar technology. Isolation diffusion in particular is to be eliminated both with regard to the elements of a single basic circuit and the connection of several such circuits. In addition, a semiconductor circuit is to be provided which, as a basic logic element, can be used to realize all logic combinations, such as a NOR circuit. Finally, the logic circuit concept to be proposed is to be such that only minimum requirements have to be met with regard to voltage supply sources and their tolerances, that it may be operated at satisfactory switching speeds over a wide current range, and that there are no restrictions with regard to the number of possible fan-ins and fan-outs.

The monolithic semiconductor circuit for a logic circuit concept of high packing density is characterized in that a semiconductor body of a first conductivity comprises at least two regions of opposite conductivity, which are spaced in relation to each other, as emitter and collector zones of a lateral transistor structure, that the collector zone of the lateral transistor structure incorporates at least one further zone of opposite conductivity as a collector zone of an inversely operated vertical transistor structure, and that for the operation of this semiconductor structure as a basic logic circuit a current flow is impressed in the emitter zone of the lateral transistor structure, which as a function of the input signal applied to its collector zone controls the current flow, serving as an output signal, through the vertical transistor structure.

The semiconductor body of the first conductivity and thus the base zone of the lateral transistor structure as well as the emitter zone of the inversely operated vertical transistor structure are advantageously connected to the same constant reference potential, preferably ground potential.

It is known for logic combinations to be realized merely with the aid of NOR circuits. A preferred embodiment of the invention is characterized in that a NOR and NAND circuit, respectively, is obtained by linking the outputs of at least two such basic circuits to a joint output. The preferred monolithic realization of such a NOR and NAND circuit, respectively, is characterized in that corresponding to the number of inputs collector regions of the lateral transistor structure are provided, which are linked with the input signals to be combined, and into which is introduced at least one collector zone of opposite conductivity, the latter being connected to form one joint output. NOR and NAND circuits with a random number of inputs may be similarly realized. NORing or NANDing is accomplished by associating the respective levels with a binary "0" or "1."

A further preferred embodiment of the invention is characterized in that the lateral and/or inversely operated vertical transistor structure comprises multi-collectors. In accordance with a further embodiment of the invention, the monolithic layout is dependent upon the number of inputs or outputs in a manner that collector regions of the lateral and vertical transistor structures are provided in accordance with the number of inputs and the number of outputs per input, respectively.

The proposed semiconductor circuit principle is, as mentioned above, universally suitable for different complex networks, such as adders, decoders, etc. Complex networks of this kind are preferably formed by linking the above basic circuits without additional isolation diffusion area; multiple emitter regions, if any, for the lateral transistor structures being connected individually, in groups or totally parallel to one or several constant current sources. These constant current sources may be formed on the semiconductor chip by means of an N+ doped resistor.

Yet a further preferred embodiment in accordance with the invention is characterized in that the monolithic layout of a decoder network consists of a semiconductor body of a first conductivity comprising at regular intervals straight, parallel arranged strips of a second opposite conductivity, which have alternating widths, that the narrow strips of the second conductivity represent the emitter regions of the lateral transistor structures and are linked at the contacts with the common current supply line, that the wide strips of the second conductivity form the collector regions of the lateral transistor structures, into which, according to the special decoder function, regions of opposite conductivity are diffused as collector regions of the inversely operated vertical transistor structures, that the wide strips of the second conductivity are provided with contacts for connecting the input signals applied to the appertaining leads, and that the straight strips of the second conductivity with their selectively diffused regions are crossed by leads of opposite conductivity which either form the decoder interconnections or represent output leads. The strips of the second conductivity, which are arranged parallel to each other, may also be of equal width. In such a case, however, maximum area savings cannot be obtained.

As in the semiconductor circuit as proposed isolation diffusions are not required, the semiconductor body may consist of the following materials: a homogeneous, preferably N doped, material; a relatively highly doped substrate to which is applied a lowly doped epitaxial region of the same conductivity. The diffusions are subsequently diffused into the latter region. Finally, it is possible to use a semiconductor body to which an epitaxial layer of opposite conductivity is applied. A further suitable alternative would be a three-layer material with a zone of sequence of, for example, N substrate/N+ diffusion layer/N epitaxial layer or P substrate/N+ diffusion layer/N epitaxial layer. The N+ layer acts as a subcollector without requiring a special masking step, that means this layer is not selectively applied. In order to obtain a high inverse current amplification factor $\beta i$ for the vertical transistor structure and an adequate transfer factor ($\alpha$) for the lateral transistor structure, it is suggested in accordance with the invention that the base diffusion for the vertical transistor structure, i.e., the collector diffusion for the lateral transistor structure, extend down to the highly doped substrate. A further advantageous measure in connection with the semiconductor circuit as proposed consists in highly doped diffusion strips of opposite conductivity being arranged in between the base regions of the different vertical transistor structures to increase the $\beta i$ value and to eliminate undesirable transistor effects.

Yet a further embodiment of the invention is characterized in that in order to obtain different switching speeds, different currents are impressed in the emitter regions of the lateral transistor structures. Thus, identical circuits can be operated at different current, power dissipation and speed values by selecting the impressed currents to be applied externally.

In summary, in comparison with known logic circuit families, the invention offers substantial area savings, since there are no isolation diffusion regions or diffused resistors. As is hereinafter explained, the semiconductor area required is reduced by about one third. Moreover, the manufacturing process is considerably simplified and is equivalent to that required for the manufacture of a single planar transistor. If one can renounce the area savings resulting from the elimination of isolation diffusions, the semiconductor circuit concept as proposed may also be realized, employing the usual process steps (with isolation diffusions). Finally, the logic circuit concept in accordance with the invention is fully compatible with known circuit families and highly flexible with regard to specific applications.

The foregoing and other objects, features and advantages of the invention will be apparent from the following more particular description of the invention as illustrated in the accompanying drawings.

BRIEF DESCRIPTION OF THE DRAWINGS

FIG. 1*a* is a schematic plan view of a semiconductor circuit in accordance with the invention;

FIG. 1*b* is a schematic cross-sectional view of the circuit;

FIG. 1*c* shows an equivalent circuit diagram;

FIG. 1*d* is a truth table of the circuit;

DESCRIPTION OF THE PREFERRED EMBODIMENTS

Figures 2A, 2B:
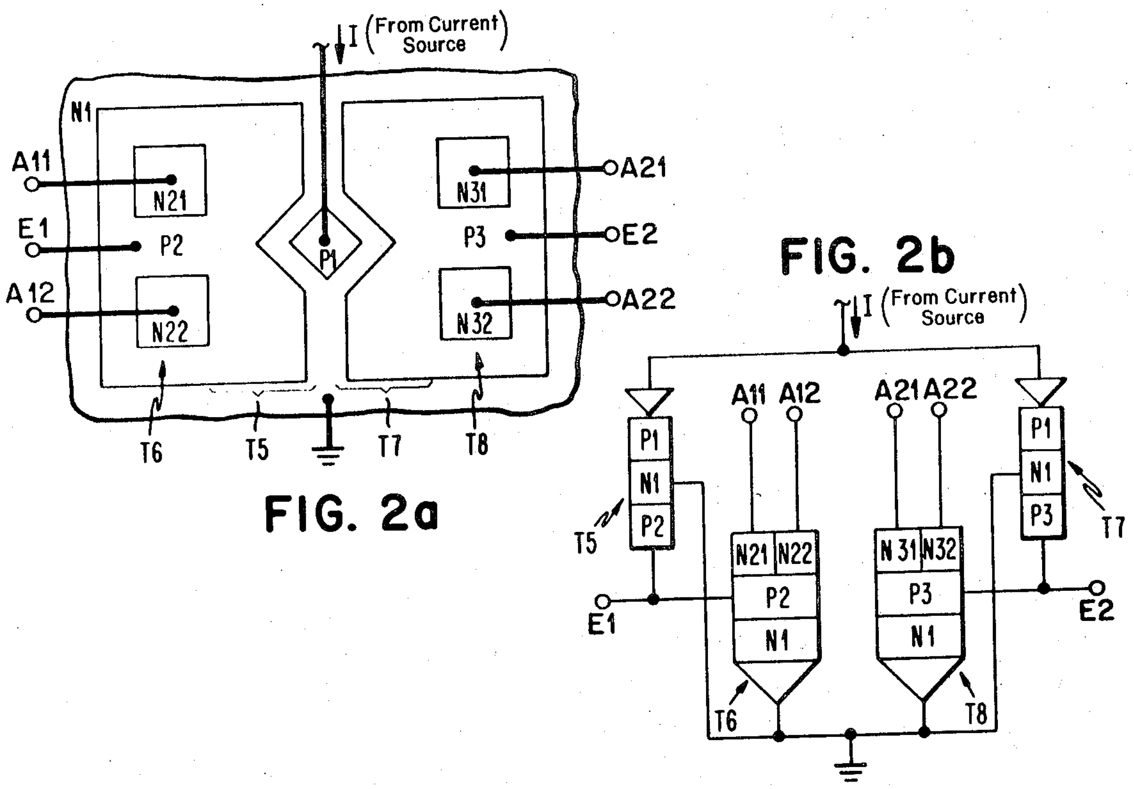
FIG. 2*a* is a schematic plan view showing another embodiment with multi-collector transistors.
FIG. 2*b* is the equivalent circuit diagram of said embodiment.

The description of the basic semiconductor circuit employed is followed by details on the complete circuit and the NOR and/or NAND functions in accordance with FIGS. 1*a–c*. Initially described are the left halves of FIGS. 1*a–c* without interconnections. Two P diffusion regions P1 and P2 are arranged spaced from each other in a semiconductor body of the N1 conductivity type. The semiconductor sequence P1/N1/P2 thus obtained forms a lateral PNP transistor T1, P1 being the emitter, N1 the base and P2 the collector of the PNP transistor.

A contact diffusion for the N1 semiconductor body and an N2 region within the P2 region are obtained by means of a further N+ diffusion. In this manner, an additional vertical transistor structure T2 with an N1/P2/N2 semiconductor sequence is produced.

This basic circuit is operated by connecting the extensive N1 region, via the N+ contact diffusion, to the reference potential (ground). Apart from this, a current I is impressed into the P1 emitter region of the lateral transistor T1. The holes thus injected into the N1 region by the P1 emitter are collected in part by the P2 collector region of the lateral PNP transistor T1. This results in the P2/N1 junction being forward biased, so that subsequently electrons from the N1 region, acting as emitter of the vertical transistor T2, may be injected into the P2 region. The P2 region represents not only the collector of the lateral PNP transistor T1 but also the base of the vertical transistor T2 which, in this case, is inversely operated. Details on the electric connection of the N2 region to the additionally represented N3 region are initially omitted. Thus, a collector current Ic occurs through the vertical transistor T2 when A is linked with a current source, for example, the input of a basic circuit, and when input E1 is left floating. However, if a ground potential is applied to E1, current Ic is prevented from flowing across the N2 collector region of the vertical T2 transistor and thus via output terminal A. Summarizing, it can be said that the current flow *Ic* via output terminal A of the basic circuit as described, is controlled as a function of the potential applied to input terminal E1. The circuit part described above may be represented in an equivalent circuit diagram in accordance with FIG. 1*c* with the transistors T1 and T2. PNP transistor T1 feeds a current into the base of the inversely operated NPN transistor T2. Transistors T1 and T2 comprise in part, common semiconductor zones, the base potential of T1, for example, is equivalent to the emitter potential of T2, so that the two transistors may be jointly realized in the N1 layer. The basic circuit as described is explained by initially referring only to T1 and T2 with the collector lead of T2 being disconnected. When E1 is left floating, current I, impressed in PNP transistor T1, flows into the base P2 of NPN transistor T2, so causing the latter to become saturation conductive. However, when E1 is connected to ground potential, current I, impressed in transistor T1, is drawn via E1 and cannot flow into the base of transistor T2. In this case, transistor T2 is blocked. Considering the potentials occurring on the collector of T2, transistors T1 and T2 form an inverter circuit.

As is known, all basic logic functions and complex logic networks can be realized, using merely NOR circuits. In that sense, the NOR function can be regarded as a basic function. If one should succeed in finding a semiconductor arrangement which requires only a very small area, and by means of which the NOR function could be realized, the cost savings obtainable with respect to computers would be substantial, since it is there where the greatest number of logic circuits are employed, for example, in the arithmetic unit and for address decoding. Proceeding from the basic circuit described above, the view of FIGS. 1*a* and 1*b* show the layout and a cross-sectional representation of a NOR circuit in accordance with the invention, which is obtained by linking the outputs of two such basic circuits. In comparison with the circuit part described above, the total semiconductor area in this case is merely extended by a further P3 diffusion region comprising an N3 region. The center P1 region constitutes the common emitter for the two lateral PNP transistors T1 and T3, while the collectors of the lateral PNP transistors form the base regions of an inversely operated vertical transistor T2 and T4, respectively. With regard to a description of the operation of this extended semiconductor arrangement, the same details apply as given in conjunction with the basic circuit.

Regarding the number of process steps and the semiconductor area required for realization, it is very advantageous in the case of this logic circuit and the embodiments of this invention that area-consuming diffused resistors and in particular undesirable area-consuming isolation regions are eliminated. As each logic circuit consisting of NOR circuits in accordance with FIG. 2*a* is fully compatible in itself, isolations in between the individual N1 regions on the semiconductor chip are not required. This results in the packing density being essentially increased and the manufacturing process of such structures being simplified so that in comparison with the intricate steps involved in the manufacturing process of field-effect transistors, an even simpler structure is obtained. The total current I for the PNP transistors is applied individually or in parallel by one or several constant current sources outside the semiconductor chip. Current may also be applied from a voltage source via one or several N+ diffused resistances (on the chip).

The NOR circuit in accordance with FIGS. 1*a–c* comprises two inputs E1 and E2 and one output A. When associating the potentials with the binary expressions in accordance with FIG. 1*a*, so that a binary "0" is represented by a potential of about 0 V and a binary "1" by a potential of about 0.7V, the logic function $\overline{X+Y}$ is obtained on output A for the input variables X on E1 and Y on E2. A NAND circuit is formed by interchanging the logical one and zero levels. The two logic circuits may, on principle, be extended to comprise any number of inputs.

Owing to the high degree of integration of the monolithic circuit arrangement in accordance with FIGS. 1*a* and 1*b*, only an approximate equivalent circuit diagram (FIG. 1*c*) can be provided. Which semiconductor zones are common to the respective transistors, may be seen from the designations of the transistor zones. With regard to a description of the functional characteristics of the circuit shown in FIG. 1*c* or an assessment of the properties of this circuit, it is pointed out that the NPN transistors T2 and T4 are inversely operated and that the PNP transistors T1 and T3 are laterally designed. The operation of the circuit in accordance with FIG. 1*c* is described by means of the truth table (FIG. 1*d*) for the input variables on input terminals E1 and E2. A "0" potential applied to both inputs results in current I, impressed in transistors T1 and T3, being drawn via the appertaining input terminals. In this case, no current is fed into the base zones of transistors T2 and T4, so that the latter are blocked. Thus, a voltage of about 0.7 V, corresponding to the binary "1," is applied to the collectors of T2 and T4 and the common output terminal A of this NOR circuit. The occurrence of the voltage of 0.7 V on output terminal A can best be explained by imagining that A is linked with at least the input E3 of a further similarly designed NOR circuit. The value of the output voltage of about 0.7 V on output terminal A corresponds in this case, to the base emitter voltage of the conductive NPN transistor of the succeeding stage. The appertaining transistor of transistors T2 and T4, respectively is or are conductive when a "1" potential is applied to either one or simultaneously to both input terminals E1 and E2. In this case, a saturation voltage of about 0 V of transistor T2 and T4, respectively, occurs on output A, and the collector current is drawn via the PNP transistor of the succeeding stage. Details on this are contained in the truth table of FIG. 1*d*.

A further embodiment of the invention emphasizing the outstanding flexibility and extendability of the basic circuit is shown in the layout of FIG. 2*a* and the equivalent circuit diagram of FIG. 2*b*. These figures show that the complete arrangement is designed symmetrically, the left and right halves being almost identical to the semiconductor circuit of FIGS. 1*a*–1*c*, with the exception that the vertical NPN transistors T6 and T8 each comprise two collectors. By means of such an arrangement, intricate networks can be formed in a sophisticated manner, as is hereinafter explained by means of the layout of a half adder and a decoder.

A P1 region, acting as an emitter of two lateral PNP transistors T5 and T7, is diffused in an N1 region common to all of these circuits. The P2 and P3 regions form the collectors of the lateral PNP transistors. By diffusing two N regions each (N21, N22 and N31, N32, respectively) into these collector regions of the lateral PNP transistors, additional inversely operated vertical NPN transistors T6 and T8, respectively, are obtained, the bases and emitters of which are coupled. For two input terminals E1 and E2, the total number of outputs available is four (A11, A12 and A21, A22). The same signals, however, decoupled from each other, occur on A11 and A12. The same applies to the output signals on A21 and A22.

Figure 3:
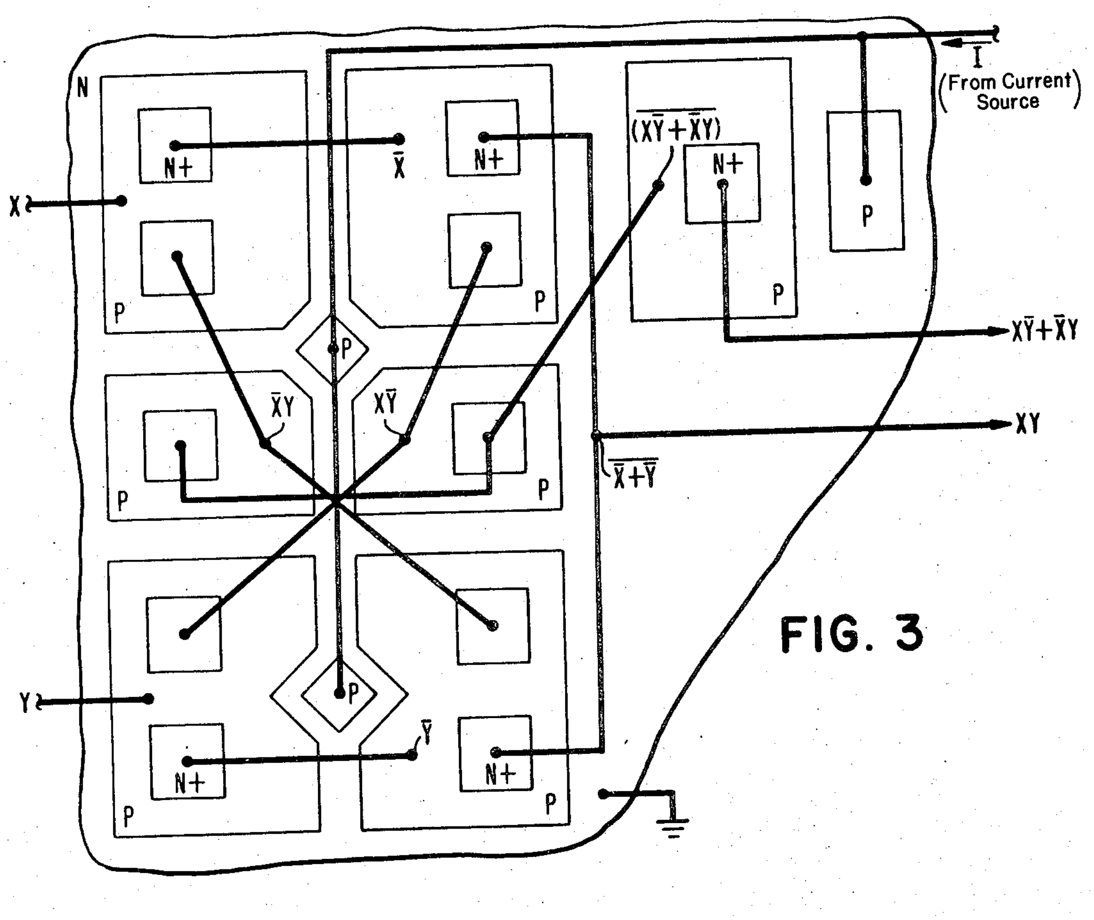
FIG. 3 shows a monolithic circuit layout of a half adder employing the basic circuits in accordance with the invention.

FIG. 3 shows the layout of a normally complex network, namely of a half adder. A layout which can be readily manufactured and which requires only a very small area can be obtained by using the multicollector structures described above both for the NPN and the lateral PNP transistors. As previously mentioned, area-consuming isolation diffusion or diffused resistors are eliminated. The input signals of the half adder are X and Y. The logic functions occurring on the individual contacts are designated and should be readily understandable from the above. The two output functions are shown in the right part of FIG. 3. The basic semiconductor circuit (FIG. 2*a*) used for the layout of the half adder (FIG. 3) offers the following advantage: inversely operated NPN transistor with more than one collector for various logic functions of the identical logic signal and PNP transistors with several collectors.

Figure 4:
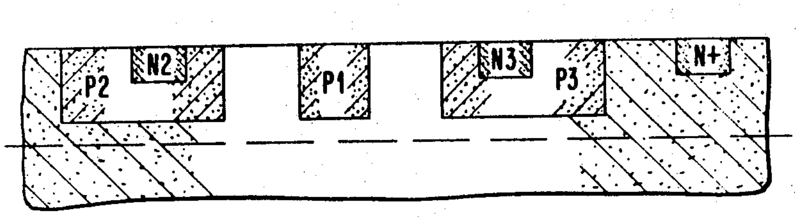
FIG. 4 is a cross-sectional representation showing different semiconductor body materials.

FIG. 4 again shows a cross-sectional view in accordance with FIG. 1*b*, by means of which an embodiment of the invention relating to different semiconductor body materials is explained. The semiconductor body may either be made of an $N^{(-)}$ material or be grown on an N or $N^-$ epitaxial layer on an N+ or P substrate. Also shown are two alternatives for a 3-layer semiconductor body, wherein a highly doped N+ diffusion layer is arranged in between the substrate and the epitaxial layer. The details to be considered in this respect are hereinafter described in conjunction with the process to be employed.

Figure 5:
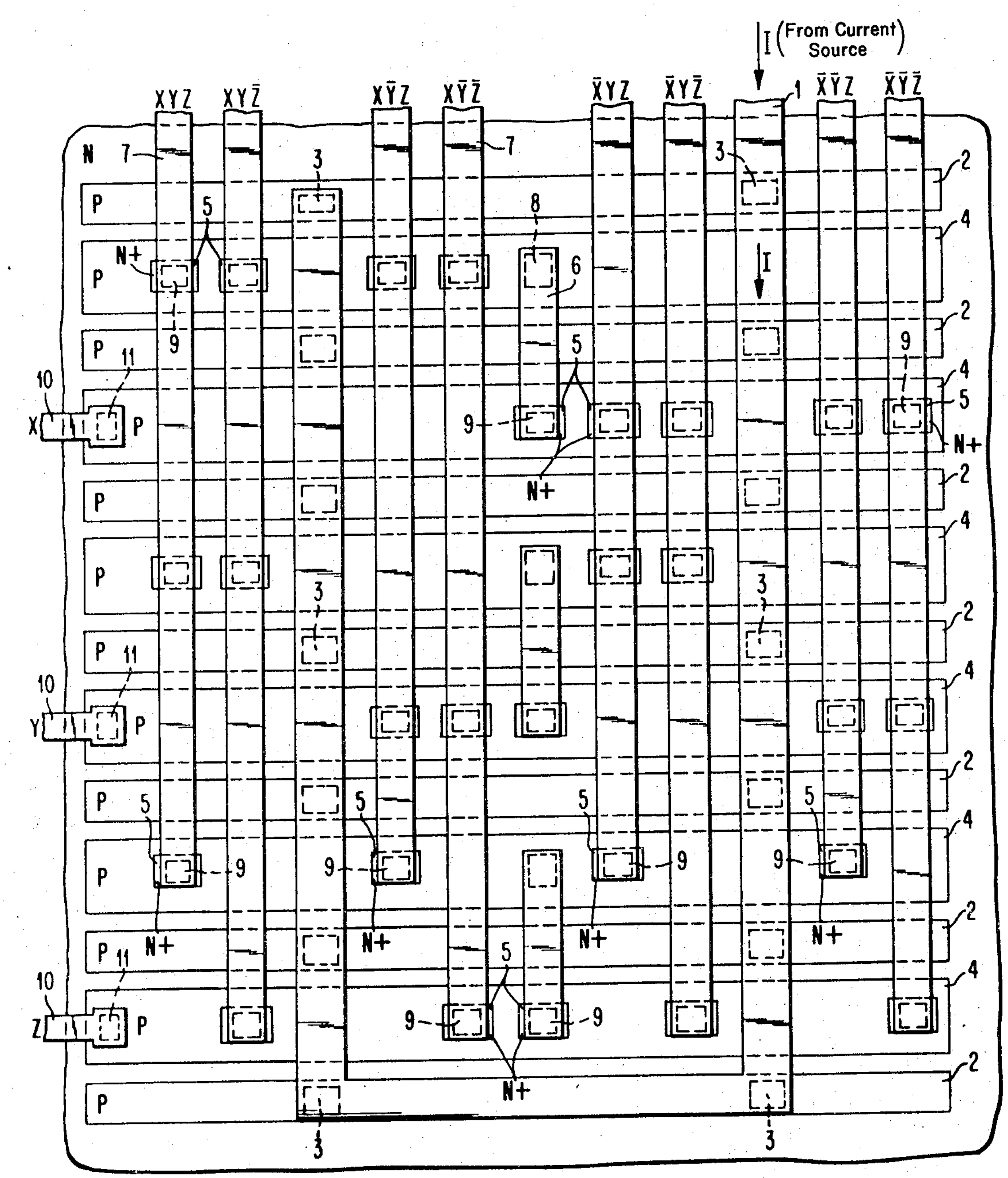
FIG. 5 is a layout of a particularly area-saving decoder network in accordance with the invention.

A further preferred embodiment of the invention is shown in FIG. 5 which refers to the layout of a decoder network with the three inputs X, Y and Z and the appertaining eight outputs XYZ . . . $\overline{X}\overline{Y}\overline{Z}$. In comparison with the advanced and highly sophisticated DTL or TTL technology, the measures in accordance with the invention when rigorously applied cut down the semiconductor surface required for this decoder by about one third.

Via U-shaped conductor 1, current I is applied to the P emitter regions 2 of the lateral PNP transistors. To this end the P emitter regions 2, which are shown as narrow horizontal regions in FIG. 5, are connected to conductor 1 on contacts 3. The P collector regions of the lateral PNP transistors, which simultaneously represent the base regions of the vertical NPN transistors, are also diffused as wide horizontal regions 4 in the continuous N-type semiconductor body. N+ emitter regions 5, which in the present case of the inversely operated NPN transistors serve as collector regions, are diffused into the P regions 4 to realize the required decoder function. The transistors thus realized are electrically interconnected by conductors 6 extending vertically, while conductors 7, also extending vertically, serve to transmit the output signals. The contacts of conductors 6 and 7 to the P and N+ regions are designated as 8 and 9, respectively. The input signals, X, Y and Z of the decoder network as shown are applied to the wide P regions; that means the base zones of the vertical NPN transistors, via conductors 10 extending horizontally and ohmic contacts 11. Output XYZ, for example, is obtained by twice negating the input values X, Y and Z and is available on vertical conductor 7 extending to the very left. Analogously, output $\overline{X}\overline{Y}\overline{Z}$ is obtained by combining the input signals, which have been negated once, via the vertical conductor extending to the very right. The intermediate decoder outputs are obtained as is shown in the circuit diagram.

In contrast to the usual decoders, for example, DTL and TTL decoders, additional phase splitters are not required. The inverted signal, for example, $\overline{X}$, can be obtained directly with the X input signal on a collector of the multi-collector decoder transistor.

As in the semiconductor circuits in accordance with the invention isolation diffusions are not required, the manufacturing process can start from an N semiconductor wafer, into which the P base regions and the N+ collector regions are subsequently diffused. The latter N+ collector regions correspond to the emitter regions of a normally operated transistor. As mentioned above, the NPN transistors in the circuits in accordance with the invention are inversely operated. High inverse current amplification factors $\beta i$ are desirable both with regard to low power dissipation and a high switching speed. Although $\beta i$ would be increased by a highly doped substrate material, the emitter efficiency of the lateral PNP transistors would be reduced correspondingly. An advantageous compromise consists of an $N^-$ epitaxial layer on an N+ substrate. An additional measure for obtaining a high inverse current amplification factor $\beta i$ provides for an N+ ring to surround the base zones of the NPN transistors, thus keeping undesirable lateral hole injection to a minimum. Yet a further measure, which is favorable for both transistor types, provides for the base diffusion to extend down to the N+ substrate or its out diffusion. The measures described above ensure inverse current amplification factors $\beta i$ of at least 10 to 20.

Experience has shown that there are hardly any deviations with regard to the base-emitter current/voltage characteristics of lateral PNP transistors, so that all P emitter regions of the semiconductor circuits in accordance with the invention can be fed in parallel. An external or internal resistor with a voltage source of about 2 V may be used as a current source. Owing to the voltage drop of only 0.8 V, power dissipation on the semiconductor wafer is very low. Depending upon the magnitude of the impressed current, the switching speed can be influenced in accordance with the invention so that the same logic circuits can be operated at low power dissipation and a relatively low speed on the one hand and at high power dissipation and a correspondingly high speed on the other. Finally, the input and output levels of the circuit components as proposed are compatible with the known and currently predominantly used DTL and TTL logic circuits, so that problems of interfacing are eliminated.

Summarizing, it can be said that the invention refers to an entirely new monolithic realization of logic circuit networks. The proposed circuit concept utilizes basic circuits having an extraordinarily high degree of integration with regard to their monolithic layout. The circuit elements of the proposed arrangement consist in the main of inversely operated vertical NPN transistors and lateral PNP transistors, whereby the two transistor types are completely integrated with respect to each other by combining similar semiconductor zones. Area-consuming isolation diffusions for the basic circuit or for connecting the proposed basic circuits to a complex network are not required. Undesirable diffused resistors are equally eliminated, so that the resultant semiconductor layout requires only a very small area and has a high yield. However, the considerable area savings are not obtained at the expense of more extensive or elaborate steps for manufacturing such semiconductor circuits. The elimination of isolation and subcollector diffusions rather leads to a substantially simplified manufacturing process, the requirements of which are identical to those necessary to produce a single planar transistor. In addition, the logic circuits in accordance with the invention permit different modes of operation with regard to power dissipation and switching speeds by influencing the impressed current accordingly.

The invention, although having been described by means of specific embodiments (half adders, decoders) and transistors of a particular conductivity type, is generally also suitable for the layout of any of the known circuits such as DTL or TTL circuits.

It is to be understood that the specific embodiments disclosed herein are merely illustrative of several of the many forms which the invention may take in practice and that numerous modifications thereof will readily occur to those skilled in the art without departing from the scope of the invention as delineated in the appended claims, and that the claims are to be construed as broadly as permitted by the prior art.

We claim:

1. A digital logic circuit comprising a first transistor of a predetermined conductivity type and having an emitter, a base and a collector, a second transistor of the opposite conductivity type and having an emitter, a base and a collector, an input adapted to receive a digital logic signal, an output, a current source, means connecting said first transistor emitter to said current source, means connecting said first transistor base to said second transistor emitter, means connecting said first transistor collector and said second transistor base to said input, and means connecting said second transistor collector to said output.

2. A pair of digital logic circuits each as recited in claim 1, means connecting said first transistor emitters of both circuits to each other, and means connecting said outputs of both circuits to each other to provide a common output.

3. A NOR digital logic gate comprising a pair of digital logic circuits each as recited in claim 1, and means dot-ORing said outputs to each other.

4. A pair of digital logic circuits each as recited in claim 1, and conductor means connecting said outputs of both circuits to a common output node.

5. A digital logic circuit comprising a first transistor of a predetermined conductivity type and having a base and a collector, a second transistor of the opposite conductivity type and having an emitter, a base and a collector, a reference voltage source, an input adapted to receive a digital logic signal, an output, means connecting said first transistor base to said reference voltage source, means connecting said first transistor collector and said second transistor base to said input, means connecting said second transistor emitter to said reference voltage source, and means connecting said second transistor collector to said output.

6. A pair of digital logic circuits each as recited in claim 5, and means connecting said outputs of both circuits to each other.

7. A NOR digital logic gate comprising a pair of digital logic circuits each as recited in claim 5, and means dot-ORing said outputs to each other.

8. A pair of digital logic circuits each as recited in claim 5, and conductor means connecting said outputs of both circuits to a common output mode.

9. A digital logic circuit comprising a first transistor of a predetermined conductivity type and having an emitter, a base and a collector, a second transistor of the opposite conductivity type and having an emitter, a base and a collector, a reference voltage source, a first input for connections to a substantially constant current source, a second input adapted to receive a digital logic signal, an output, means connecting said first transistor emitter to said first input, means connecting said first transistor base to said reference voltage source, means connecting said first transistor collector and said second transistor base to said second input, means connecting said second transistor emitter to said reference voltage source, and means connecting said second transistor collector to said output.

10. A pair of digital logic circuits each as recited in claim 9, means connecting said first inputs of both circuits to each other, and means connecting said outputs of both circuits to each other to provide a common output.

11. A NOR digital logic gate comprising a pair of digital logic circuits each as recited in claim 9, and means dot-ORing said outputs to each other.

12. A pair of digital logic circuits each as recited in claim 9, and conductor means connecting said outputs of both circuits to a common output node.

13. A logic circuit comprising a first transistor of a predetermined conductivity type and having an emitter, a base, and a collector, a second transistor of the opposite conductivity type and having an emitter, a base, and collector, means connecting said first transistor collector to said second transistor base, means connecting said first transistor base to said second transistor emitter, an input connected to said first transistor collector and said second transistor base, and an output connected to said second transistor collector.

14. A logic circuit as recited in claim 13 and comprising a current source connected to said first transistor emitter, and a source of fixed potential connected to said first transistor base and second transistor emitter.

15. A pair of logic circuits each as recited in claim 13, and means connecting the outputs of both logic circuits to provide a NOR/NAND circuit.

16. A pair of logic circuits each as recited in claim 13, and means connecting the output of one circuit to the input of the other circuit so as to connect the circuits in cascade.

17. Logic circuitry comprising a first pair of logic circuits each as recited in claim 13, first output means connecting the outputs of said first pair of circuits to provide a first NOR/NAND circuit, a second pair of logic circuits each as recited in claim 14, second output means connecting the outputs of said second pair of circuits to provide a second NOR/NAND circuit, and means connecting said first output means to an input of said second pair of circuits so as to connect said NOR/NAND circuits in cascade.

* * * * *